US010930476B2

(12) United States Patent
Aramaki et al.

(10) Patent No.: US 10,930,476 B2
(45) Date of Patent: *Feb. 23, 2021

(54) PLASMA PROCESSING DEVICE

(71) Applicant: HITACHI HIGH-TECHNOLOGIES CORPORATION, Tokyo (JP)

(72) Inventors: Tooru Aramaki, Tokyo (JP); Kenetsu Yokogawa, Tokyo (JP); Masaru Izawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 603 days.

This patent is subject to a terminal disclaimer.

(21) Appl. No.: 15/204,183

(22) Filed: Jul. 7, 2016

(65) Prior Publication Data
US 2017/0011890 A1    Jan. 12, 2017

(30) Foreign Application Priority Data

Jul. 9, 2015  (JP) .............................. JP2015-137389

(51) Int. Cl.
H01J 37/32 (2006.01)
C23C 16/46 (2006.01)
(Continued)

(52) U.S. Cl.
CPC .... H01J 37/32532 (2013.01); C23C 16/4586 (2013.01); C23C 16/46 (2013.01);
(Continued)

(58) Field of Classification Search
CPC ........... H01J 37/32532; H01J 37/32724; H01J 37/32522; H01J 37/32192;
(Continued)

(56) References Cited

U.S. PATENT DOCUMENTS 5,557,215 A * 9/1996 Saeki .................. H01L 21/6833
324/756.01
5,584,971 A * 12/1996 Komino ................ C23C 14/541
204/192.13

(Continued)

FOREIGN PATENT DOCUMENTS

JP          2003-68955      *   3/2003
JP          2014-112672 A       6/2014
JP          2014-150160 A       8/2014

Primary Examiner — Jeffrie R Lund
(74) Attorney, Agent, or Firm — Mattingly & Malur PC

(57) ABSTRACT

A plasma processing device that includes a processing chamber which is disposed in a vacuum vessel and is decompressed internally, a sample stage which is disposed in the processing chamber and on which a sample of a process target is disposed and held, and a plasma formation unit which forms plasma using process gas and processes the sample using the plasma, and the plasma processing device includes: a dielectric film which is disposed on a metallic base configuring the sample stage and connected to a ground and includes a film-like electrode supplied with high-frequency power internally; a plurality of elements which are disposed in a space in the base and have a heat generation or cooling function; and a feeding path which supplies power to the plurality of elements, wherein a filter to suppress a high frequency is not provided on the feeding path.

8 Claims, 6 Drawing Sheets

(51) Int. Cl.
 *C23C 16/458* (2006.01)
 *C23C 16/511* (2006.01)
(52) U.S. Cl.
 CPC .......... *C23C 16/463* (2013.01); *C23C 16/511* (2013.01); *H01J 37/32009* (2013.01); *H01J 37/32192* (2013.01); *H01J 37/32522* (2013.01); *H01J 37/32715* (2013.01); *H01J 37/32724* (2013.01)
(58) Field of Classification Search
 CPC .......... H01J 37/32715; H01J 37/32009; C23C 16/511; C23C 16/4586; C23C 16/463; C23C 16/46
 See application file for complete search history.

(56) References Cited

U.S. PATENT DOCUMENTS

| | | | | |
|---|---|---|---|---|
| 5,650,904 | A * | 7/1997 | Gilley | H01L 37/02 361/56 |
| 5,761,908 | A * | 6/1998 | Oas | F24F 12/006 62/3.2 |
| 7,206,184 | B2 * | 4/2007 | Ennis | H01J 37/32165 361/230 |
| 9,058,960 | B2 * | 6/2015 | Ehrlich | H01J 37/3244 |
| 9,781,803 | B2 * | 10/2017 | Brandes | H05B 45/50 |
| 2003/0029569 | A1 * | 2/2003 | Natsuhara et al. | |
| 2004/0261721 | A1 * | 12/2004 | Steger | |
| 2007/0089834 | A1 * | 4/2007 | Brillhart | H01L 21/67069 156/345.27 |
| 2009/0086776 | A1 * | 4/2009 | Funada | H01S 5/0612 372/28 |
| 2010/0193130 | A1 * | 8/2010 | Kawakami | H01L 21/67109 156/345.37 |
| 2012/0125014 | A1 * | 5/2012 | Ilercil | F25B 21/04 62/3.3 |
| 2014/0216657 | A1 | 8/2014 | Kusumoto et al. | |
| 2014/0356985 | A1 * | 12/2014 | Ricci | H01L 21/67109 438/11 |
| 2016/0079107 | A1 * | 3/2016 | Aramaki | H01L 21/6833 156/345.51 |
| 2016/0351404 | A1 * | 12/2016 | Aramaki | H01J 37/32183 |
| 2017/0011890 | A1 * | 1/2017 | Aramaki | H01J 37/32532 |
| 2017/0092472 | A1 * | 3/2017 | Koiwa | F28F 27/02 |
| 2018/0076048 | A1 * | 3/2018 | Gohira | H01J 37/32724 |
| 2019/0198297 | A1 * | 6/2019 | Aramaki | H01J 37/32568 |
| 2020/0103147 | A1 * | 4/2020 | Ilercil | F25B 21/04 |

\* cited by examiner

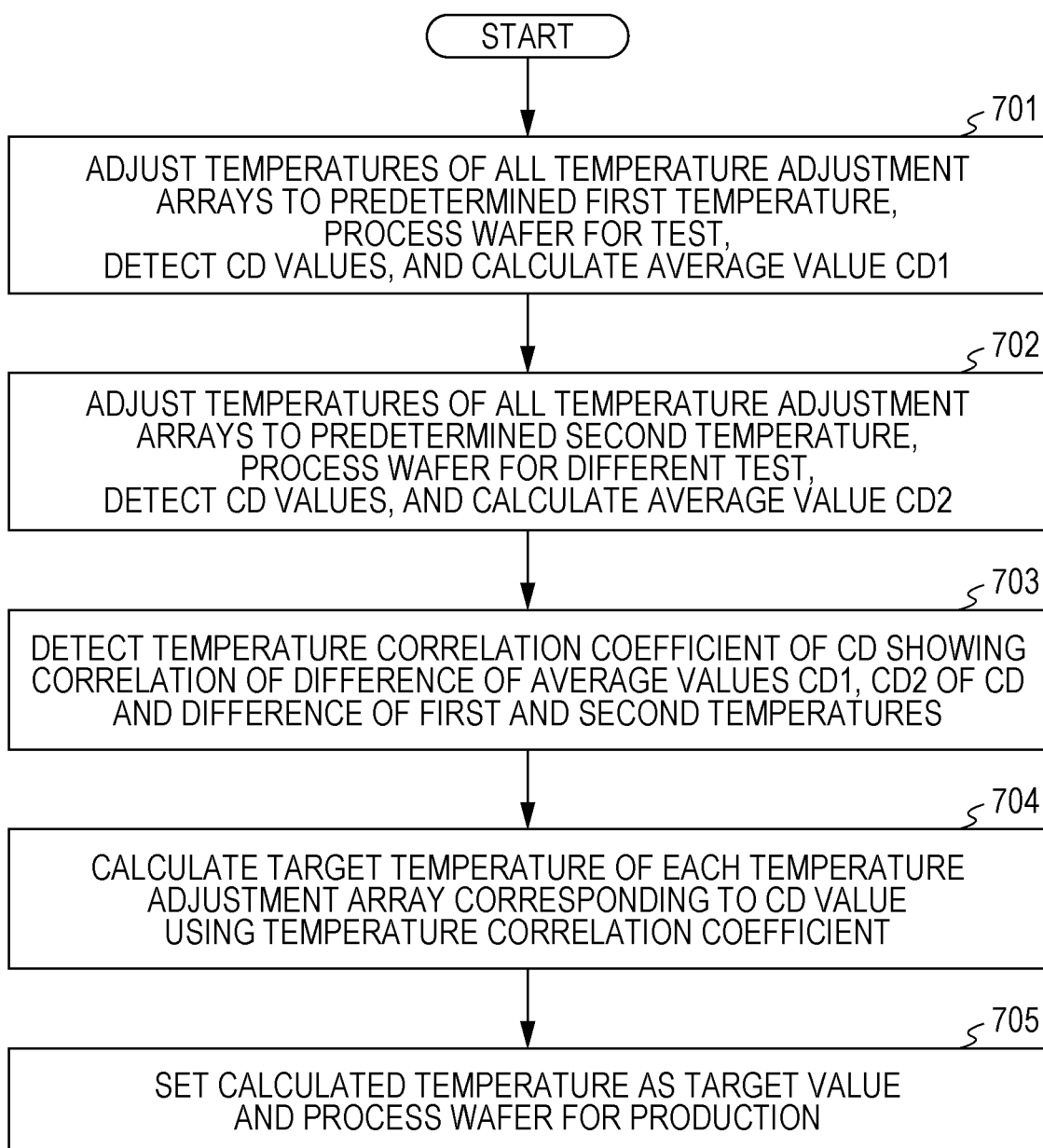

PLASMA PROCESSING DEVICE

BACKGROUND OF THE INVENTION

1. Field of the Invention

The present invention relates to a plasma processing device and a plasma processing method that dispose and hold a sample of a substrate shape such as a semiconductor wafer of a process target on a sample stage disposed in a processing chamber to be disposed in a vacuum vessel and internally decompressed and process a film layer of a process target of a film structure having a plurality of film layers including a mask previously disposed on a top surface of the sample, using plasma formed in the processing chamber. More particularly, the present invention relates to a plasma processing device that transfers heat between a sample disposed on a sample stage and the sample stage and processes the sample while adjusting a temperature of the sample.

2. Description of the Related Art

In a process for manufacturing a semiconductor device, a film layer on a top surface of a substrate such as a semiconductor wafer is generally processed using plasma to have a desired shape. For example, a plasma process for processing a film layer of a process target such as polysilicon on which a resist mask layer is formed in a shape along the mask layer by etching a place not covered with a mask is executed.

A plasma processing device typically a vacuum vessel that has a processing chamber provided therein, a gas supply device that is connected to the vacuum vessel and supplies process gas to form plasma and process a sample to the processing chamber, a vacuum exhaust device that includes a vacuum pump such as a turbo-molecular pump and a rotary pump for roughing to exhaust gas or particles in the processing chamber and decompress an inner portion to a predetermined vacuum degree, a sample stage in which a wafer to be the sample is disposed on a top surface on which a dielectric film is disposed, and a plasma generation device which supplies an electric field or a magnetic field to excite the process gas supplied to the processing chamber and generate the plasma to the processing chamber. In a state in which the sample disposed on the dielectric film configuring the top surface of the sample stage is adsorbed and held on the dielectric film using electrostatic force formed by power supplied to an electrode for electrostatic adsorption in the sample stage, atoms or molecules of the process gas supplied to the processing chamber from an introduction port of a shower plate configuring a ceiling surface of the processing chamber and disposed on the processing chamber are excited using the electric field or the magnetic field formed by the plasma generation device and the plasma is formed. Then, a potential difference with a potential of the plasma is formed by a bias potential formed by high-frequency power supplied to a metallic electrode disposed in the sample stage, charged particles of the plasma are attracted to a surface of a film layer of a process target on the top surface of the sample according to the potential difference to cause the charged particles to collide with the film layer, a mutual action with reactive particles in the plasma is accelerated, and an etching process is executed on the film layer.

According to a recent demand for improving integration of a semiconductor device, there are a demand for improving minute processing, that is, processing precision and a demand for adjusting a temperature of the surface of the sample during processing, affecting a dimension such as a line width of a circuit of the semiconductor device after the processing, with high precision, according to minuteness of the line width of the circuit. Meanwhile, recently, it is demanded to use a sample such as a semiconductor wafer having a large diameter to suppress a manufacturing cost of a semiconductor device element from increasing. To adjust the temperature of the sample with high precision in a plane of a substrate, it is necessary to adjust a distribution of values of the temperature of the substrate surface for each divided region in the plane and the temperature in the plane to a predetermined distribution with high precision. To achieve this, it is thought that a region of a sample placement surface of the sample stage is divided into a plurality of regions and the temperature is adjusted variably in each region.

An example of the related art is disclosed in JP-2014-150160-A. JP-2014-150160-A discloses that a plurality of heaters disposed at positions corresponding to a plurality of divided regions of a placement surface are included in a dielectric film configuring the placement surface on which a semiconductor wafer of a sample stage is disposed, the heaters disposed in a ring shape on a portion of an outer circumferential side of the placement surface are divided into a plurality of concentric regions, a current control element connected in parallel to each of the concentric portions of the heaters is disposed, a current flowing to the heater is bypassed to adjust an amount of current flowing to the concentric portion, and temperatures of the placement surface and the portion of the outer circumferential side of the sample with respect to a circumferential direction of the portion of the outer circumferential side of the ring shape are adjusted to a desired temperature. In addition, JP-2014-150160-A discloses that power of a power supply for the heater is consumed at the bypass side such that the power becomes constant, the temperature of the sample on the heater is predicted using a temperature sensor disposed in the sample stage located below the heater, and an amount of power supplied to the heater or an amount of heat generation of the heater and the temperature of the sample are adjusted on the basis of a result predicted by an observer.

Further, JP-2014-112672-A discloses that a plurality of heater arrays (including a Peltier element) are disposed in a ceramic film in which an electrode to electrostatically adsorb a sample is disposed, power controlled by time average control is supplied to each array, values of temperatures and a distribution thereof with respect to an in-plane direction on a top surface of the film are adjusted to be suitable for a process.

SUMMARY OF THE INVENTION

In the related art, a problem occurs because the following points are not sufficiently considered.

That is, according to the present inventors, the temperature can be adjusted for each of the regions obtained by dividing the surface of the wafer with respect to the in-plane direction, but a use is limited and obtained performance is limited.

For example, in JP-2014-150160-A, the temperature of the top surface of the dielectric film increased or decreased by heating of the heater disposed in the dielectric film disposed on the base to be the electrode made of the metallic member in the sample stage is predicted and detected using an output from the temperature sensor disposed in the base below the heater and a heating degree of the heater is adjusted. In this configuration, when the number of elements of the temperature sensors increases, a temperature detection time increases and responsiveness of control of the temperature is lowered.

In addition, in JP-2014-112672-A, because the high-frequency power is applied to the base in the sample stage, a shield structure to prevent the high-frequency power from being superposed on the heater array disposed in the ceramic film is provided. For this reason, a filter disposed on a primary side of the heater array is complicated and a manufacturing or maintenance cost increases.

An object of the present invention is to provide a plasma processing device that has a simple structure and high responsiveness.

The object is achieved by a plasma processing device that includes a processing chamber which is disposed in a vacuum vessel and is decompressed internally, a sample stage which is disposed in the processing chamber and on which a sample of a process target is disposed and held, and a plasma formation unit which forms plasma using process gas and processes the sample using the plasma, and the plasma processing device includes: a dielectric film which is disposed on a metallic base configuring the sample stage and connected to a ground and includes a film-like electrode supplied with high-frequency power internally; a plurality of elements which are disposed in a space in the base and have a heat generation or cooling function; and a feeding path which supplies power to the plurality of elements, wherein a filter to suppress a high frequency is not provided on the feeding path.

According to the present invention, high-frequency power and an element for temperature adjustment in a sample stage are isolated from each other and a configuration for feeding the element is simplified. In addition, a configuration for sealing inner and outer sides of the sample stage airtightly can be simplified.

BRIEF DESCRIPTION OF THE DRAWINGS

Other objects and advantages of the invention will become apparent from the following description of embodiments with reference to the accompanying drawings in which:

FIG. 7 is a flowchart illustrating a process for detecting a target temperature of each temperature adjustment array by a control device in the plasma processing device according to the embodiment illustrated in FIG. 1.

DESCRIPTION OF THE PREFERRED EMBODIMENTS

Figure 1:
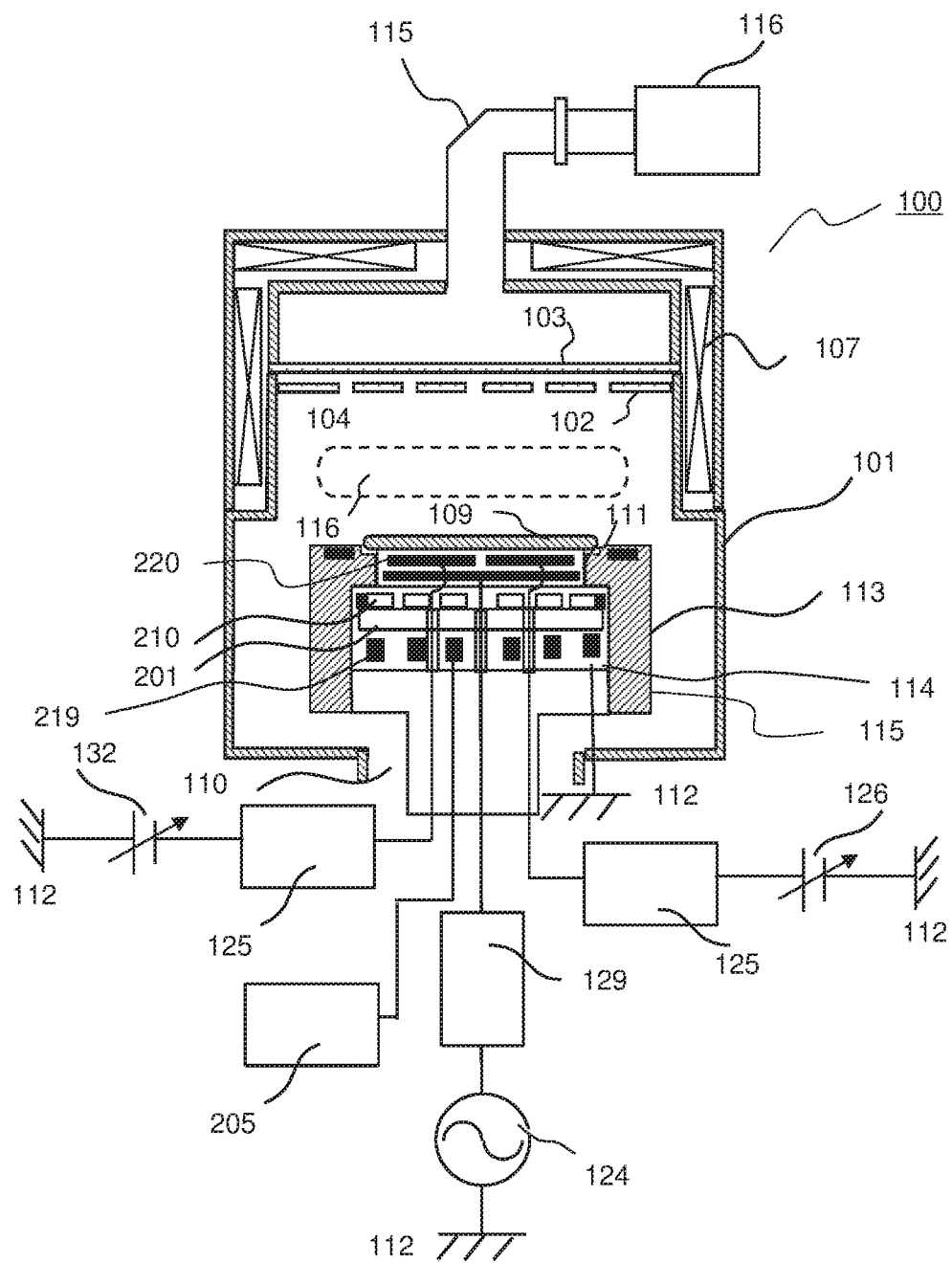
FIG. 1 is a longitudinal cross-sectional view schematically illustrating a configuration of a plasma processing device according to an embodiment of the present invention.

Preferred embodiments of the present invention will be described in detail below with reference to the accompanying drawings, wherein like reference numerals refer to like parts throughout.

The present invention has a plurality of temperature adjustment arrays not having a high-frequency cut filter and has a simple feeding structure.

First Embodiment

Hereinafter, an embodiment of the present invention will be described using FIGS. 1 to 3B. FIG. 1 is a longitudinal cross-sectional view schematically illustrating a configuration of a plasma processing device according to an embodiment of the present invention. Particularly, in the plasma processing device according to this embodiment, electron cyclotron resonance (ECR) is induced using an electric field of a microwave band of a specific frequency and a magnetic field of strength suitable for the electric field, plasma is formed, and an etching process is executed on a sample of a substrate shape such as a semiconductor wafer of a process target.

In a plasma processing device 100 according to this embodiment, an outer circumferential end of a dielectric window 103 such as quartz transmitting a microwave is disposed on an upper end of a sidewall of a circular cylindrical shape of a vacuum vessel 101 which has a circular cylindrical shape and of which an upper portion is opened, inner and outer sides of the vacuum vessel 101 are airtightly sealed, and a processing chamber 104 to be a space of a circular cylindrical shape, which is internally decompressed and in which plasma is formed, is configured. In addition, a vacuum exhaust port 110 communicating with the processing chamber 104 is disposed on a lower portion of the vacuum vessel 101 and the lower portion of the vacuum vessel 101 is connected to a vacuum exhaust device (not illustrated in the drawings) including a vacuum pump that is disposed below the vacuum vessel 101 with the vacuum exhaust port 110 therebetween.

In a place configuring a ceiling surface of the processing chamber 104 below the dielectric window 103 configuring an upper portion of the vacuum vessel 101, a plurality of through-holes through which etching gas is introduced into the processing chamber 104 are disposed in a center portion and a shower plate 102 of a cylindrical shape made of quartz is disposed.

To transmit the electric field to generate the plasma in the processing chamber 104 to the processing chamber 104, a waveguide 105 that is connected to a center of an upper portion of a circular cylindrical cavity to transmit the electric field and has a circular cross-section is disposed on the dielectric window 103, on the vacuum vessel 101. The waveguide 105 includes a circular cylindrical portion of which a center axis extends in a vertical direction and a rectangular portion of which one end is connected to an upper end of the circular cylindrical portion and an axis extends in a horizontal direction and which has a rectangular cross-section. The electric field propagating through an inner portion is oscillated by a power supply 106 disposed on the other end of the rectangular portion and is supplied to the rectangular portion.

In this embodiment, a frequency of the electric field for the plasma formation is not limited in particular. However, in this embodiment, a microwave of 2.45 GHz is used. On the cavity connected to a lower end of the circular cylindrical portion of the waveguide 105 and having a diameter larger than a diameter of the waveguide 105 and equal to a diameter of the processing chamber 104 and at an outer circumferential side of lateral portions of the cavity and the processing chamber 104, coils 107 to form a magnetic field are disposed to surround the cavity and the processing chamber 104. The electric field that is formed in the power supply 106, propagates through the waveguide 105, passes through the cavity, transmits the dielectric window 103, and is supplied to the processing chamber 104 acts mutually with the magnetic field formed by the coils 107 and supplied to the processing chamber 104 and excites atoms or molecules of the process gas introduced into the processing chamber 104. Plasma 116 of a high density is generated in the processing chamber 104 by excited particles of the process gas.

Figure 2:
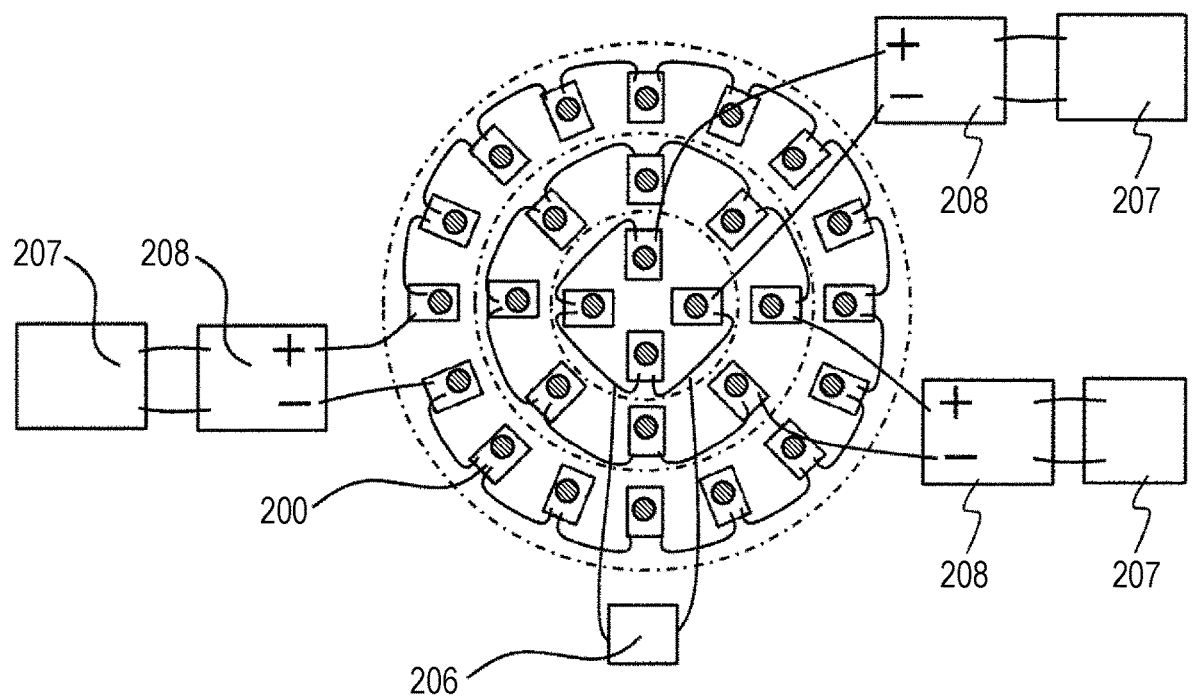
FIG. 2 is an enlarged horizontal cross-sectional view schematically illustrating an arrangement of temperature adjustment arrays of a sample stage of the plasma processing device according to the embodiment illustrated in FIG. 1.
Figure 3A:
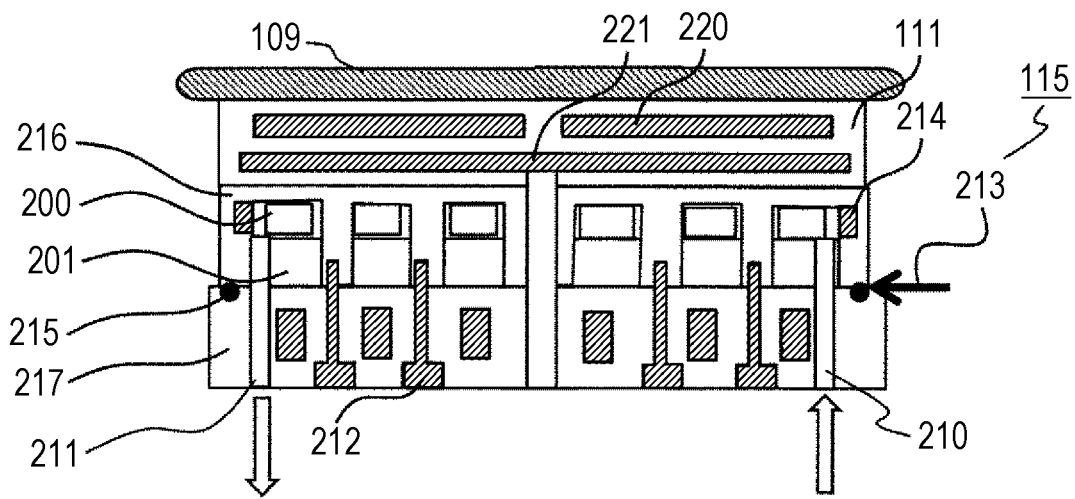
FIGS. 3A and 3B are enlarged cross-sectional views schematically illustrating a configuration of the sample stage of the plasma processing device according to the embodiment illustrated in FIG. 1.
Figure 3B:
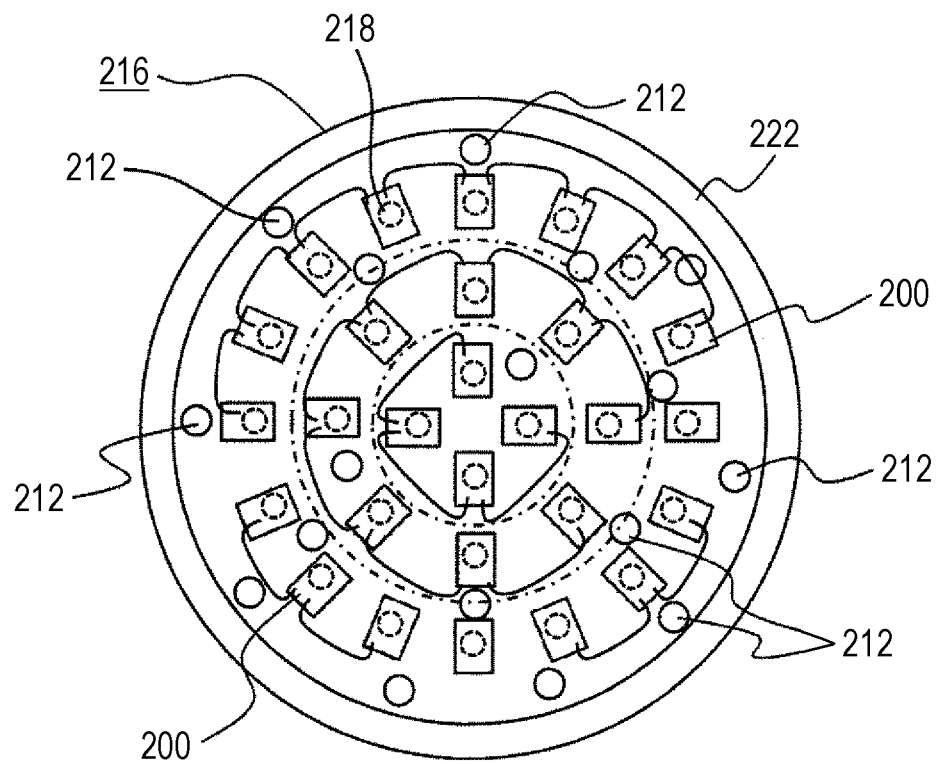

A configuration of a sample stage according to an embodiment of the present invention will be described using FIGS. 1 to 3B. FIG. 2 is an enlarged horizontal cross-sectional view schematically illustrating an arrangement of temperature adjustment arrays of the sample stage of the plasma processing device according to the embodiment illustrated in FIG. 1. FIGS. 3A and 3B are enlarged cross-sectional views schematically illustrating the configuration of the sample stage of the plasma processing device according to the embodiment illustrated in FIG. 1. FIG. 3A illustrates a longitudinal cross-section and FIG. 3B illustrates a horizontal cross-section.

A sample stage 115 of which a top surface faces a bottom surface of the dielectric window 103 or the shower plate 102, a wafer 109 to be a sample being disposed on the top surface, is disposed in a lower portion in the processing chamber 104 illustrated in FIG. 1. The sample stage 115 has a circular cylindrical shape and the top surface thereof on which the wafer 109 is disposed is covered with the dielectric film 111.

Conductive films 220 for electrostatic adsorption that are supplied with direct-current power and form electrostatic force by a charge between the dielectric film 111 and the wafer 109 are disposed in the dielectric film 111. Each of the conductive films 220 according to this embodiment has a tandem type with a plurality of teeth. However, the individual teeth are inserted between the teeth such that the individual teeth are engaged.

The conductive film 220 of the upper left side of FIG. 1 is electrically connected to a direct-current power supply 132 having negative polarity via a high-frequency filter 125. In addition, the conductive film 220 of the upper right side of FIG. 1 is electrically connected to a direct-current power supply 126 having positive polarity via the high-frequency filter 125.

In addition, a conductive film 221 is disposed below the conductive film 220 in the dielectric film 111, the conductive film 221 and the high-frequency power supply 124 are electrically connected via a matching circuit 129, and high-frequency power for bias potential formation is supplied from a lower side of a center of the wafer 109. The conductive film 221 and the conductive film 220 for an electrostatic chuck to which the high-frequency power is supplied is surrounded with a dielectric material made of ceramics such as alumina and yttria configuring the dielectric film 111 and are disposed under gas of the processing chamber 104 decompressed to a predetermined vacuum degree.

In this example, the two conductive films 220 are disposed at a position symmetric with a center of the wafer 109 having a discoid shape or a shape equal to the discoid shape or an axis passing the center. The reason is as follows. When or if the high-frequency power supplied to the conductive film 221 flows through a feeding position of the conductive film 220 on the conductive film 221, a high-frequency electric field may be generated in the conductive film 220. That is, even though the electric field by the high-frequency power is generated in the conductive film 220, the two films are disposed symmetric with the center of the wafer 109, so that a difference of adsorption strength or performance is reduced at the left and right sides.

In this embodiment, the reason why the high-frequency power is applied from the center of the wafer 109 is as follows. The gas in the processing chamber 104 of the plasma processing device 100 is exhausted at a position aligned with an axis of a circular cylinder of the sample stage 115, from the vacuum exhaust port 110 in which the axis is disposed.

The wafer 109 is disposed at a position matched with a center of a wafer placement surface having a circular shape equal to a shape of the dielectric film 111 of an upper portion of the sample stage 115. On a top surface of the wafer 109, distributions of pressures (partial pressures) of the process gas or reaction products and particles of the plasma form a concentric shape around a center axis. As a result of an etching process, a processing shape and performance such as a characteristic of etching become also a distribution of a concentric shape. For this reason, the electric field of the high-frequency power is distributed in a concentric shape from the center, the pressure distribution of particles such as the process gas is corrected with a concentric shape, and a variation of the distribution of the processing shape of the wafer 109 with respect to a circumferential direction is reduced to be approximately equalized.

In addition, because the sample stage 115 according to this embodiment needs to cool heat generated by the high-frequency power supplied from the direct-current power supplies 126 and 132 and the high-frequency power supply 124 or the temperature adjustment array 220 disposed in a base 114, a cooling medium flow channel 219 through which the cooling medium flows is disposed in the base 114. Upper and lower sensors for pins (not illustrated in the drawings) that contact a back surface of the wafer 109 with a leading end thereof and ascends or descends the wafer 109 on the dielectric film 111 in a state in which the upper and lower arms hold the wafer 109 are disposed in the base 114. The sensors may malfunction in a state in which there is electrical noise.

In addition, the cooling medium flowing through the cooling medium flow channel may be electrostatically charged in the electric field. Therefore, in this embodiment, as illustrated in the drawings, the base 114 is electrically connected to a ground electrode 112. By this configuration, even though an insulating cooling medium such as a fluorocarbon cooling medium is not used, a configuration of a pipe to supply a cooling medium using water or ethylene glycol and circulate the cooling medium can be simplified and an environment load can be reduced.

In this embodiment, the temperature adjustment array 200 disposed in the base 114 is also disposed in a space surrounded with a member having a ground potential, a high-frequency cut filter to suppress high-frequency power for bias formation from being supplied to a power supply of a primary side to supply power to the temperature adjustment array 200 can be omitted, and a configuration of the sample stage 115 including the temperature adjustment array 200 is simplified.

The wafer 109 carried in the processing chamber 104 is electrostatically adsorbed and held on a top surface of the dielectric film 111 by the electrostatic force formed between the dielectric film 111 and the wafer 109 by the direct-current voltage applied from the direct-current power supplies 126 and 132. In this state, the etching gas is introduced into a gap between the dielectric window 103 and the shower plate 102 via a mass flow controller (not illustrated in the drawings) and diffuses through the gap, the gap is filled with the etching gas, and the etching gas passes through a gas introduction hole to be a through-hole disposed in a center portion of the shower plate 102 and is introduced into the processing chamber 104 to be supplied to the sample stage 115 from the upper side.

As described above, the electric field and the magnetic field are supplied from the waveguide 105 and the coil 107, the process gas is excited, and the plasma 116 is generated in the processing chamber 104. The high-frequency power is supplied from the high-frequency power supply 124 connected to the conductive film 221 disposed in the dielectric film 111 of the sample stage 115, charged particles of the plasma 116 are attracted to a surface of a process target film of a film structure for a device circuit configured using a plurality of film layers including a mask previously formed on the surface of the wafer 109, according to a potential difference of a bias potential formed on a top surface of the wafer 109 and the plasma 116, the charged particles collide with the surface of the film, and the etching process of the corresponding film layer is executed. The etching gas or the particles of the reaction products generated by etching are scattered downward along a flow in the processing chamber 104, passes through the vacuum exhaust port 110 communicating with the lower portion of the processing chamber 104, are input to an inlet of a vacuum pump (not illustrated in the drawings), and are exhausted.

In this embodiment, the sample stage 115 is disposed in the processing chamber 104 decompressed to a vacuum degree suitable for the process. Meanwhile, the temperature adjustment array 200 is disposed in the metallic base 114 and an inner side thereof is disposed in a space held at an atmospheric pressure. The space is formed between a metallic cap-type structure 216 and a metallic discoid cooling plate 217 to be upper and lower members configuring the base 114.

The cap-type structure 216 has at least one recessed portion formed with an opening provided in a bottom surface at an inner side of an outer circumferential wall of a discoid shape, contacts a top surface of a flat shape of the cooling plate 217 with a sealing member such as an O-ring therebetween, in a state in which the plurality of temperature adjustment arrays 200 are stored in the recessed portion, and is connected to the cooling plate 217. In addition, because the cap-type structure 216 is connected to the ground electrode 112 and has a ground potential at all times, the cap-type structure 216 has a constant potential and prevents a high-frequency electric field from being transmitted to the space in the recessed portion. For this reason, in this embodiment, a complicated high-frequency cut filter is not used on a feeding path of the temperature adjustment arrays 200 and the plasma processing device 100 including the sample stage 115 according to this embodiment in which the plurality of temperature adjustment arrays 200 are disposed can be simplified.

In addition, the thickness between the wafer 109 and the temperature adjustment array 200 is preferably decreased to the thickness capable of holding structural strength, to realize heat transfer between each of the plurality of temperature adjustment arrays 200 and the wafer 109 with high precision, such that the recessed portion of the cap-type structure 216 is under the atmospheric pressure and a temperature of the top surface of the wafer 109 becomes a predetermined value. To satisfy conflicting requests, in this embodiment, a plurality of protrusions are disposed in the recessed portion of the cap-type structure 216. Leading ends of the protrusions are disposed at positions corresponding to openings of the through-holes disposed in a contact surface of the cooling plate 217 connected to lower ends of the protrusions with the cap-type structure 216.

In a state in which the cap-type structure 216 and the cooling plate 217 contact each other, screws or bolts 212 are inserted into female screws through the through-holes from the lower portion of the cooling plate 217 and both the cap-type structure 216 and the cooling plate 217 are fastened. Because the O-ring to airtightly seal inner and outer sides is interposed and held in a portion of an outer circumferential side of a bottom surface of a sidewall of a circular cylinder of the cap-type structure 216 having a circular cylindrical shape or a discoid shape, the leading ends of the protrusions in the recessed portion of the cap-type structure 216 and the surface of the portion of the outer circumferential side of the bottom surface of the cap-type structure 216 are disposed on the same plane 213 to contact the top surface of the cooling plate 217 under the same pressure.

In a state in which the cap-type structure 216 and the cooling plate 217 are connected and fastened, the temperature adjustment arrays 200 and heat insulating placement stages 201 disposed below the temperature adjustment arrays 200, having elasticity, and made of an insulating material are interposed by the top surface of the inner wall of the recessed portion of the cap-type structure 216 and the top surface of the cooling plate 217 in a space surrounded with the inner wall of the recessed portion of the cap-type structure 216 and the top surface of the cooling plate 217 and positions thereof are fixed. In this state, the heat insulating placement stage 201 is compressed in a vertical direction and is deformed. In this state, repulsive force generated when the heat insulating placement stage 201 is compressed and deformed in a vertical direction pushes the temperature adjustment array 200 disposed on the heat insulating placement stage 201 to the top surface of the inner wall of the cap-type structure 216, contacts the temperature adjustment array 200 with the cap-type structure 216, and forms a pressure of a contact in which a heat transfer amount sufficient for adjusting the temperature of the top surface of the cap-type structure 216 or the top surface of the sample stage 115 with high precision by the temperature adjustment array 200 is obtained.

To realize the above configuration, the bottom surface of the cap-type structure 216 according to this embodiment is formed by polishing, including a sealing surface of the portion of the outer circumferential side, after the recessed portion and the plurality of protrusions are formed. In a state in which both the cap-type structure 216 and the cooling plate 217 are fastened by the bolts 212, flatness of a connection surface is maintained and the top surface of the cap-type structure 216 on which the dielectric film 111 is disposed is flattened, so that a variation of a distance between each temperature adjustment array 200 having a temperature sensor 218 and the wafer 109 on each temperature adjustment array 200 is reduced. Thereby, a variation of gradients of a temperature of each temperature adjustment array 200 and a temperature of a corresponding place of the wafer 109 disposed on the temperature adjustment array 200 is suppressed, a deviation of thermal conduction or adsorption performance of the wafer 109 with respect to an in-plane direction is suppressed, and the temperature can be adjusted with high precision. In addition, because the recessed portion is under a pressure equal to the atmospheric pressure, a sealing structure of a feeding portion of each temperature adjustment array 200 is unnecessary or simplified and a cost of the device is reduced.

Because the temperature adjustment array 200 to adjust the heat or the heat generation amount is disposed in the internal space of the member having the ground potential, it is not necessary to use a fluorocarbon cooling medium to be a cooling medium of an insulation system to suppress the high-frequency power from leaking, water or ethylene glycol having conductivity can be used as the cooling medium, a load of an environment in which the device is disposed is reduced, and a pipe member of a circulation device of the cooling medium can be simplified.

As illustrated in FIGS. 3A and 3B, a sealing portion 222 that contacts the cooling plate 217 with an O-ring 215 disposed at the outer circumferential side of the bottom surface of the cap-type circular cylindrical structure 216 therebetween is disposed to surround the recessed portion and the plurality of temperature adjustment arrays 200 in the recessed portion. The heat of the cap-type structure 216 is transmitted to the cooling medium of the cooling medium flow channel 219 of the cooling plate 217 via the sealing portion 222 and the temperature of the outer circumferential portion of the cap-type structure 216 may deviate from the predetermined value. In this embodiment, a heat insulating layer 214 having a high heat insulating material is disposed in a ring shape at the outside of the temperature adjustment array 200 in the recessed portion of the cap-type structure 216, transfer of the heat at a corresponding outer circumferential portion is suppressed, and the temperature of the wafer 109 is suppressed from deviating from the predetermined value. Even when the temperature cannot be sufficiently suppressed from deviating from the predetermined value at the portion of the outer circumferential side of the wafer 109 despite the heat insulating layer 214 is used, a heating mechanism such as a heater may be disposed instead of the heat insulating layer 214 or in the heat insulating layer 214 and the temperature of the region of the outer circumferential side of the wafer 109 may be adjusted.

As illustrated in FIG. 2, in this embodiment, the plurality of temperature adjustment arrays 200 are disposed in a concentric shape at a plurality of radius positions around a center axis of the cap-type structure 216 of the cylindrical shape in a direction vertical to a plane of paper in FIG. 2 and the plurality of temperature adjustment arrays 200 at the individual radius positions are electrically connected to each other. As illustrated in FIG. 2, because the feeding path is disposed on the center of the sample stage 115 according to this embodiment to supply the high-frequency power for the bias formation to the center of the circular conductive film 221 in the dielectric film 111, the temperature adjustment array 200 is disposed on a center portion of the recessed portion of the cap-type structure 216.

Each of the plurality of temperature adjustment arrays 200 according to this embodiment has a Peltier element to be fed and a temperature difference is generated between two surfaces of the Peltier element, so that a temperature of a member connected to one surface can be increased or decreased. In addition, each of the plurality of temperature adjustment arrays 200 according to this embodiment is provided with a current bypass relay 206 (only one current bypass relay is illustrated in FIG. 2) and can adjust each temperature to a desired value individually. In this embodiment, in an aggregation of the plurality of temperature adjustment arrays 200 disposed in a circumferential direction at the individual radius positions, the two temperature adjustment arrays adjacent to each other in the circumferential direction are electrically connected to each other. The two temperature adjustment arrays of both ends of the aggregation of the plurality of temperature adjustment arrays 200 are connected to a constant current power supply 207 via positive and negative terminal electrodes of a polarity switch 208 to send a signal to switch between a Peltier mode and a heater mode.

In FIG. 2, connection with the constant current power supply 207 and the polarity switch 208 with respect to only the aggregation of the temperature adjustment arrays 200 at the radius positions of the outermost circumference is illustrated. However, at least one aggregation disposed at radius positions of an inner circumferential side is connected to a pair of the constant current power supply 207 and the polarity switch 208. In this embodiment, for each aggregation of the temperature adjustment arrays 200 disposed to correspond to a predetermined concentric region of the wafer 109 of the upper side with respect to the circumferential direction at each radius position, operation switching between heating and cooling of each aggregation and heating and cooling amounts are adjusted by an operation of a pair of the constant current power supply 207 and the polarity switch 208.

As such, in this embodiment, in the plurality of aggregations of the temperature adjustment arrays 200 disposed in the circumferential direction in the regions corresponding to the plurality of radius positions, the temperature adjustment arrays adjacent to each other are connected in series. As a result, to correspond to a distribution of a concentric shape of a density of particles of gas or radical in the processing chamber 104 on the wafer 109, a distribution of the temperature of the top surface of the wafer 109 or the dielectric film 111 can be set differently in the radial direction and correction can be performed to suppress a change in the circumferential direction. For this function, the polarity of the Peltier element of the temperature adjustment array 200 can be set equally in the circumferential direction for every aggregation and can be set differently in the aggregation of the temperature adjustment arrays at the different radius positions.

In this embodiment, a space surrounded and divided by the recessed portion of the cap-type structure 216 and the cooling plate 217 in a state in which the base 114 is configured is under a pressure equal to the atmospheric pressure, air is sealed in the space, and moisture is included in the space. For this reason, in FIGS. 3A and 3B, when the temperature adjustment array 200 is driven in the Peltier mode and is used in a cooling operation, condensation may be formed in the space and water droplets may cause a short circuit in the Peltier element of the temperature adjustment array, and a malfunction or a failure may occur. To suppress the condensation, in this embodiment, air heated at a predetermined temperature and having reduced relative humidity or gas such as rare gas is introduced into the recessed portion from an introduction port 210 and the air is exhausted from the space through an exhaust port 211 for circulation.

In addition, each temperature adjustment array 200 according to this embodiment has the temperature sensor 218 and a signal output from the temperature sensor disposed in each temperature adjustment array 200 is transmitted to a control device not illustrated in the drawings. A command signal calculated on the basis of a value showing a temperature detected from the signal in the control device is transmitted to each of the previous temperature adjustment arrays 200 or the plurality of temperature adjustment arrays 200 including other temperature adjustment array 200 and drive of the Peltier element or the heater element is adjusted.

The adjustment of the temperature adjustment array 200 is also performed by bypassing a current by the non-polar bypass relay 206 connected to each temperature adjustment array 200. The reason why the bypass relay 206 according to this embodiment is the non-polar bypass relay is to bypass the current without depending on the mode, because the temperature adjustment array 200 switches between the Peltier mode and the heater mode by switching of a direction (polarity) of the current.

In addition, the bypass relay 206 needs to have a value of resistance sufficient lower than resistance of the temperature adjustment array 200 to improve bypass performance of the bypass relay 206. According to an examination of the present inventors, the bypass relay 206 can be used practicably by setting a resistance value equal to or smaller than about ⅕ of the resistance value of the temperature adjustment array 200.

Figure 4A:
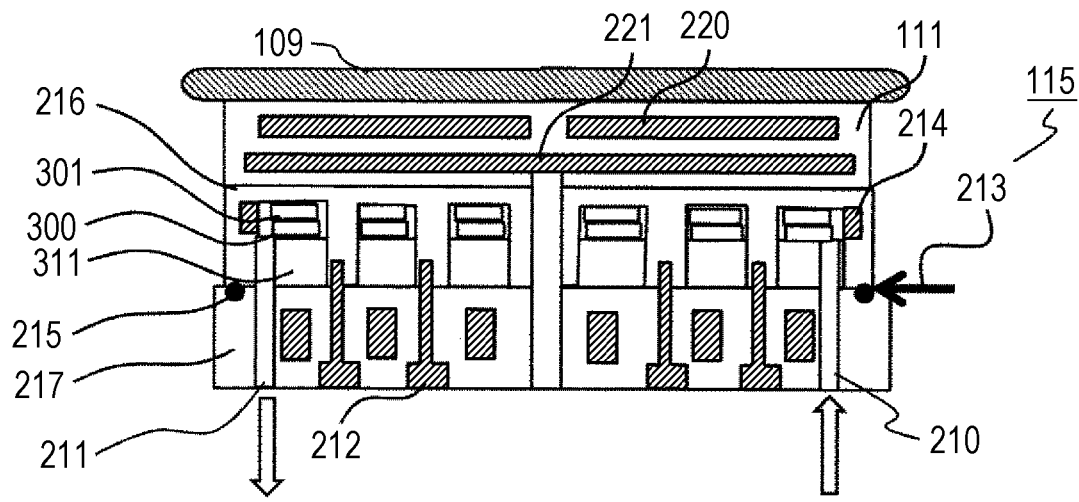
FIGS. 4A and 4B are enlarged cross-sectional views schematically illustrating a configuration of a sample stage of a plasma processing device according to a modification of the embodiment illustrated in FIG. 1.
Figure 4B:
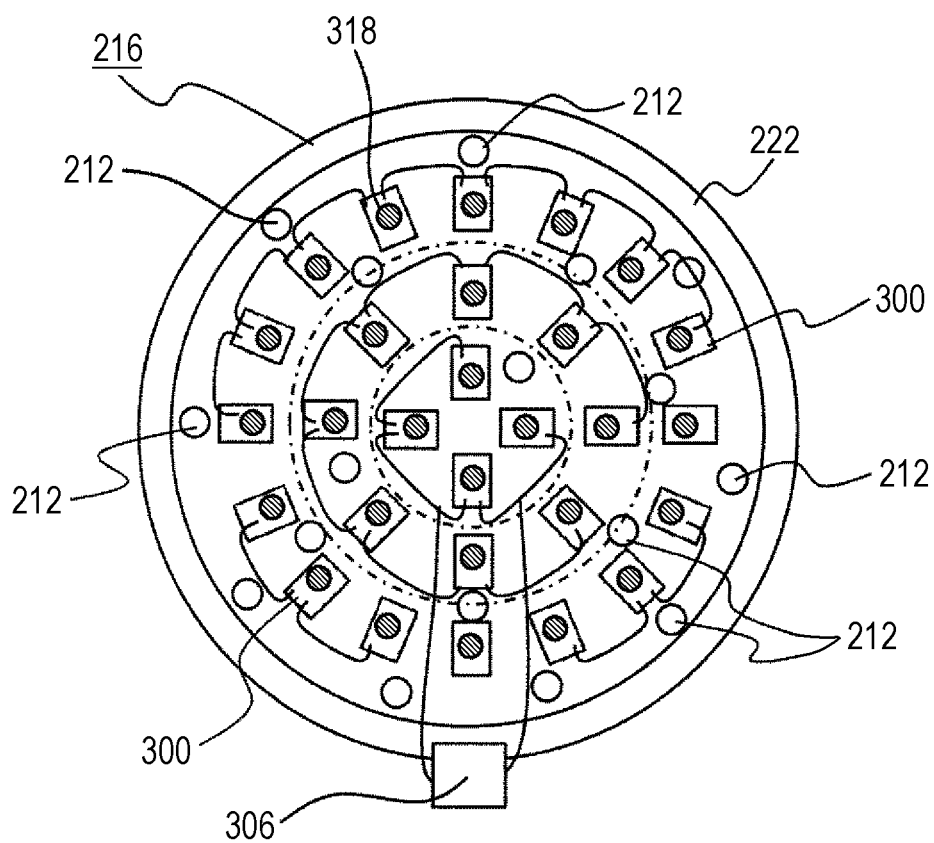

A modification of the electrode structure according to the embodiment of the present invention will be described using FIGS. 4A and 4B. FIGS. 4A and 4B are enlarged cross-sectional views schematically illustrating a configuration of a sample stage of a plasma processing device according to a modification of the embodiment illustrated in FIG. 1. FIG. 4A illustrates a longitudinal cross-section and FIG. 4B illustrates a horizontal cross-section.

As illustrated in FIGS. 4A and 4B, in this example, a pair of each temperature adjustment array 300 and each temperature sensor 318 is disposed vertically. In a state in which the cap-type structure 216 and the cooling plate 217 are connected and fastened and the base 114 is configured, the temperature sensor 318 is interposed by the temperature adjustment array 300 below the temperature sensor 318 and a top surface of an inner wall of a recessed portion of the cap-type structure 216 on the temperature sensor 318 and contacts both the temperature adjustment array 300 and the cap-type structure 216. In this configuration, a control device not illustrated in the drawings detects a temperature on the basis of a signal output from each temperature sensor 318 and adjusts drive of elements of each temperature adjustment array 300 or the plurality of temperature adjustment arrays 300 by bypassing a current using a non-polar bypass relay 306.

In this example, each of the temperature sensor 318 and the temperature adjustment array 300 is configured using a film-like member. The temperature sensor 318 has a film-like structure 301 having the same thickness as the thickness of an element disposed around an element to detect the temperature and reduces a deviation or a variation of heat transmitted to the temperature sensor 318 interposed between the inner wall of the recessed portion of the cap-type structure 216 and the temperature adjustment array 300, with respect to an in-plane direction of a film.

The temperature adjustment array 300 according to this example is operated in only a motor mode. For this reason, because a direction of a current flowing to each element during an operation of the plasma processing device 100 does not change, a polar bypass relay can be used as the bypass relay. In addition, according to the examination of the present inventors, the bypass relay can be used practicably by setting a resistance value equal to or smaller than about ⅕ of the resistance value of the temperature adjustment array 200.

To obtain heat conduction sufficient for realizing temperature adjustment with desired precision by contacting the temperature adjustment array 300 with the top surface of the inner wall of the recessed portion of the cap-type structure 216 under a sufficient pressure, a heat insulating structure 311 made of an elastic member is disposed between the temperature adjustment array 300 and the top surface of the cooling plate 217 in a space in the recessed portion. In this configuration, in a state in which the cap-type structure 216 and the cooling plate 217 are connected and fastened, the temperature adjustment array 300, the temperature sensor 318 disposed on the temperature adjustment array 300, and the heat insulating structure 311 are interposed between the cap-type structure 216 and the cooling plate 217 and contact each other. The temperature adjustment array 300 and the temperature sensor 318 disposed on the temperature adjustment array 300 are pushed from the heat insulating structure 311 to the top surface of the inner wall of the recessed portion of the cap-type structure 216 by repulsive force generated when the heat insulating structure 311 having the elasticity is compressed and deformed or pressing force transmitted from the cooling plate 217 and a sufficient contact pressure is generated between the temperature sensor 318 and the cap-type structure 216.

The heat insulating structure 311 has a shape equal to a shape of a rectangular parallelepiped. However, the shape of the heat insulating structure 311 is not limited thereto. Because the heat insulating structure 311 has a heat insulating property, the heat insulating structure 311 can suppress the heat generated by the heater of the temperature adjustment array 300 from being transmitted to the cooling plate 217 and adjust the temperature of the top surface of the cap-type structure 216 with high precision. To realize the heat transfer or temperature adjustment, a heat transfer rate of the heat insulating structure 311 according to this example is preferably 5 W/mK or less.

Figure 5:
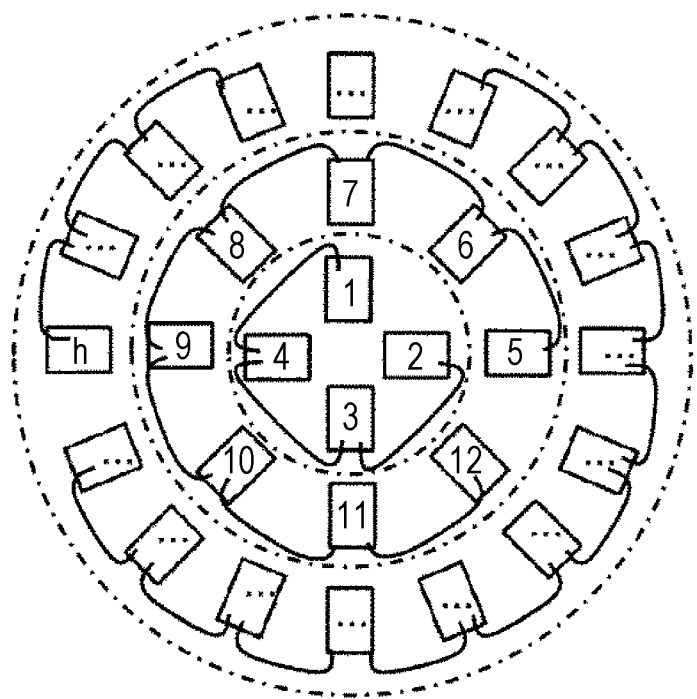
FIG. 5 is a horizontal cross-sectional view schematically illustrating an arrangement of temperature adjustment arrays in the sample stage according to the embodiment illustrated in FIG. 2.

Control of an operation of the temperature adjustment array in the embodiment will be described using FIG. 5. FIG. 5 is a horizontal cross-sectional view schematically illustrating an arrangement of temperature adjustment arrays in the sample stage according to the embodiment illustrated in FIG. 2. In FIG. 5, the temperature adjustment arrays 200 disposed in the cap-type structure 216 of the sample stage 115 having a circular cross-section are disposed radially in a radial direction from the center at an interval of the same angles in a circumferential direction at three radius positions and configure three aggregations electrically connected in series.

Numbers are assigned to the temperature adjustment arrays 200 sequentially from one end of a row of arrays to the other end in the aggregation of the temperature adjustment arrays 200 of the innermost circumference. If numbers are assigned to all of the temperature adjustment arrays 200 (1 to 4 in this example) of the innermost circumference, numbers are assigned to all of the temperature adjustment arrays 200 (in this example, 5 to 12) sequentially from one end of a row of arrays to the other end at first outer circumference side, and this process is repeated until numbers are assigned to all of the temperature adjustment arrays 200 in the aggregation of the temperature adjustment arrays 200 of outermost circumference. As a result, numbers are assigned to all of the temperature adjustment arrays 200 of the sample stage 115.

A process for adjusting the temperature of the top surface of the sample stage 115 or the dielectric film 111 by adjusting an operation of each of the temperature adjustment arrays 200 to which numbers 1 to h are assigned will be described below. In this configuration, if an adjustment target temperature is set, the operation of each temperature adjustment array 200 is executed by feedback control such as PID control controlled according to a command signal sent by the control device not illustrated in the drawings, which receives the signal output from the temperature sensor 218.

Hereinafter, detection of a target temperature (sensor feedback temperature) Tn of an (n-th) element having any number n will be described. A temperature Twn in a place of the top surface of the wafer 109 disposed on the n-th element of the temperature adjustment array 200 is calculated from data showing a value of a critical dimension (CD) representing a shape of the wafer 109 as follows.

A correlation of the value of the CD and the temperature is 1:1 and the target temperature is calculated from a correlation coefficient and the value of the CD and is set. That is, an influence constant λkn from the n-th element to a k-th element is determined according to a distance between the temperature adjustment arrays and positions thereof. For example, in the case in which the temperature of the k-th temperature adjustment array 200 rises by 10% after a predetermined time when the temperature of the n-th temperature adjustment array is set by 1° C. by previous experiments, the influence constant λkn is determined as 0.1. When the influence constant is determined uniquely, it is thought that the temperature of the n-th temperature adjustment array 200 and the temperatures of the surrounding temperature adjustment arrays 200 are in a proportional relation.

In addition, the temperature of the wafer 109 is increased by the heat input from the plasma 116. An amount of heat input from the plasma 116 and the magnitude of the high-frequency power for the bias formation are in a predetermined correlation and the amount of heat input from the plasma 116 is calculated by applying a correlation coefficient K to the magnitude of the high-frequency power for the bias formation. This is because it is necessary to relatively decrease the temperature of the top surface of any temperature adjustment array 200 driven in a Peltier mode or a heater mode to adjust the temperature of the wafer 109 to a predetermined value, when a value of the high-frequency power for the bias formation is relatively large, and the target temperature of the temperature adjustment array 200 and the heat input amount or the magnitude of the high-frequency power are in an inversely proportional relation.

In addition, the correlation coefficient changes depending on the kind of the process gas, the internal pressure of the processing chamber 104, and the material of the member configuring the sample stage 115. An influence of the kind, the internal pressure, and the material is represented by a coefficient Z and the target temperature of the k-th temperature adjustment array 200 is detected on the basis of the following formula, in the control device according to this embodiment.

[Formula 1]

$$Tk = \sum_{n=1}^{n=h} (\lambda kn \times Twn) \div (K \times RF) \qquad \text{(formula 1)}$$

Tn: control temperature (sensor feedback temperature) of n-th element
Twn: temperature of wafer on n-th element
Λkn: influence constant from n-th element to k-th element
K: proportional constant
RF: bias power In this example, each coefficient of the formula (1) is detected previously by experiments, is stored in a storage device such as a RAM and a ROM in the control device, and is set. In the control device, the target temperature of each of the first to h-th temperature adjustment arrays 200 is detected using a value of each coefficient during processing of the wafer 109. In this configuration, the temperature of the wafer 109 is not predicted by an observer. As in this example, even though the operation of the temperature adjustment arrays 200 of the same number disposed in each of multiple places is adjusted to adjust the temperatures of the multiple places, responsiveness of the adjustment can be sufficiently raised and a practical application is enabled.

Figure 6:
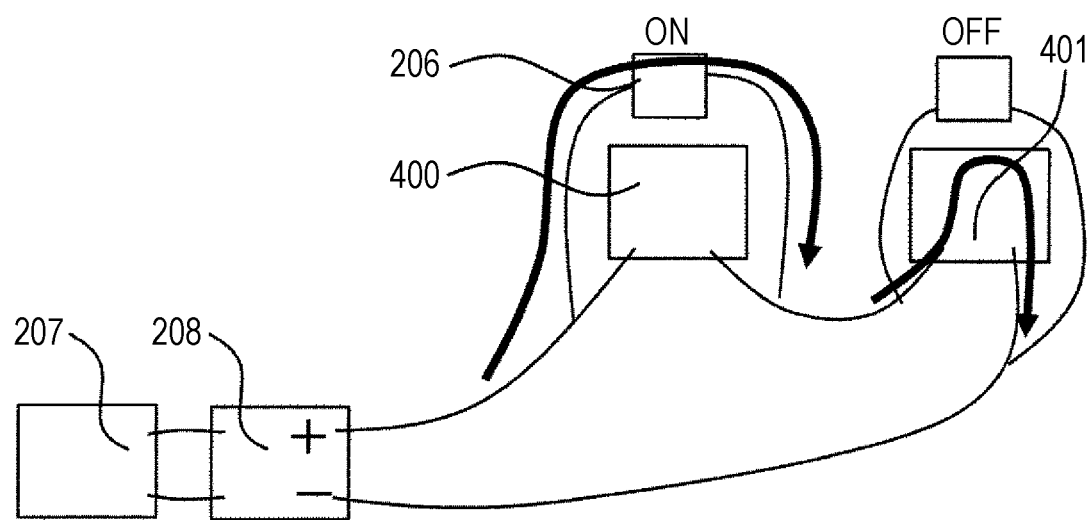
FIG. 6 is a diagram schematically illustrating an operation of the temperature adjustment arrays of the sample stage according to the embodiment illustrated in FIG. 2.

An example of the operation of the temperature adjustment arrays according to this embodiment will be described using FIG. 6. FIG. 6 is a diagram schematically illustrating the operation of the temperature adjustment arrays of the sample stage according to the embodiment illustrated in FIG. 2.

In FIG. 6, each of temperature adjustment arrays 400 and 401 has the same configuration as the configuration of the temperature adjustment array 200 illustrated in FIG. 2. Each of the temperature adjustment arrays 400 and 401 is electrically connected in series to the constant current power supply 207 via the positive and negative terminal electrodes of the polarity switch 208, each temperature adjustment array has the bypass relay 206 connected to a path supplying power in parallel to each temperature adjustment array, and an element of each temperature adjustment array is operated in the heater mode.

When a temperature detected from a signal detected by the temperature sensor of the temperature adjustment array 401 is higher than the target temperature detected by the mechanism illustrated in FIG. 5, it is necessary to decrease a current supplied to the temperature adjustment array 400 or stop the temperature adjustment array 400 and decrease an amount of heat to be generated. For this reason, the bypass relay 206 connected in parallel to the temperature adjustment array 400 is turned on to bypass the current supplied to the temperature adjustment array 400 according to a command signal from the control device. When the temperature monitored by the temperature adjustment array 401 is lower than the target temperature, the bypass relay 206 is turned off to supply the current to the temperature adjustment array 400. An ON or OFF period of the bypass relay 206 is set to be proportional to a difference between the temperature detected by the control device from an output received from the temperature sensor 218 and the target temperature, to be proportional to an integral value of the difference, and to be proportional to a differential value of the difference, using the difference.

A process for detecting the target temperature from a distribution of detected CD values will be described using FIG. 7. FIG. 7 is a flowchart illustrating a process for detecting a target temperature of each temperature adjustment array by the control device in the plasma processing device according to the embodiment illustrated in FIG. 1.

In FIG. 7, before processing the wafer 109 to manufacture a semiconductor device as a product, the temperatures of all of the temperature adjustment arrays 200 are adjusted to become a predetermined first temperature, a wafer 109 for a test having the same configuration as the configuration of the wafer 109 for the product and having the same film structure as the film structure of the wafer 109 for the product on a top surface is pressed under the same process conditions (so-called recipe) such as a pressure of the processing chamber 104, a composition of the process gas, and a flow rate, a shape of a surface of the wafer 109 for the test is measured, and a CD average value 1 is detected (step 701). Next, the temperature of the temperature adjustment array 200 is adjusted to become a second temperature different from the first temperature, a wafer 109 for a different test is processed, a shape of a surface of the wafer 109 for the different test is measured, and a CD average value 2 is detected (step 702).

Next, a correlation of a difference of the CD average value 1 and the CD average value 2 and a difference of the first and second temperatures is detected and a temperature correlation coefficient of the CD values is detected (step 703). The target temperature of each temperature adjustment array 200 corresponding to the CD value measured using the temperature correlation coefficient or used as a specification of a processing shape is calculated (step 704). A calculated temperature value is set as the target temperature and the wafer 109 for the product is processed (step 705).

For example, a graphical user interface (GUI) may be displayed on a display unit of a display device such as a CRT and a liquid crystal monitor connected to the plasma processing device 100, such that a user inputs the CD measurement value 1 and the first temperature and the CD measurement value 2 and the second temperature using the GUI, and the plasma processing device 100 may be operated by the control device, on the basis of the input values. The control device executes PWM control on the bypass relay 206, on the basis of the value of the target temperature received via a communication interface connected to a communication unit not illustrated in the drawings. In addition, an arithmetic unit such as a microprocessor made of a semiconductor in the control device reads software describing an algorithm to adjust an operation of each temperature adjustment array 200 according to the received value of the target temperature and the value of the temperature detected from the signal output from the temperature sensor 218 from a storage device such as a RAM, a ROM, and a hard disk where the software is previously stored and calculates a command signal for control.

A calibration method of the plurality of temperature sensors 218 is described. Because the temperature sensors 218 are degraded over time, a temperature of a surface of the sample stage 115 close to a position where a temperature monitor is disposed at a cooling medium temperature of 220° C. may be detected and the value of the temperature detected from the temperature sensor 218 may be calibrated. A standard temperature sensor used for the calibration may be a wafer-type sensor or a contact-type thermometer and any temperature measurement device that is already calibrated at the time of measurement may be used. In this embodiment, the temperature sensor is a thermister. However, a PT sensor, a thermocouple, and a fluorescent thermometer may be used.

In addition, in this embodiment, a silicon oxide film is set as the material of the etching process target and methane tetrafluoride gas, oxygen gas, and methane trifluoride gas are used as the etching gas and the cleaning gas. However, the same effect is obtained even when not only the silicon oxide film but also a polysilicon film, a photoresist film, an organic antireflection film, an inorganic antireflection film, an organic material, an inorganic material, a silicon oxide film, a silicon nitride oxide film, a silicon nitride film, a Low-k material, a High-k material, an amorphous carbon film, a Si substrate, and a metal material are set as the material of the etching process target. In addition, chlorine gas, hydrogen bromide gas, methane tetrafluoride gas, methane trifluoride, difluoride methane, argon gas, helium gas, oxygen gas, nitrogen gas, carbon dioxide, carbon monoxide, hydrogen, ammonia, octafluoro propane, nitrogen trifluoride, sulfur hexafluoride gas, methane gas, silicon tetrafluoride gas, silicon tetrachloride gas, neon gas, krypton gas, xenon gas, and radon gas can be used as the etching gas.

In the embodiment described above, the etching device using the microwave ECR discharge has been described. However, the same function and effect can be obtained even in a dry etching device using other type of discharge (effective magnetic field UHF discharge, capacitance-coupled discharge, induction-coupled discharge, magnetron discharge, surface-wave excitation discharge, and transfer-coupled discharge). In addition, in the embodiment described above, the etching device has been described. However, the same function and effect can be obtained even in other type of a plasma processing device to perform plasma processing, for example, a plasma CVD device, an asking device, and a surface modification device.

What is claimed is:

1. A plasma processing apparatus that includes a processing chamber which is disposed in a vacuum vessel and is decompressed internally and a plasma is generated using process gas supplied therein, and a sample stage which is disposed in the processing chamber and on which a sample of a process target is disposed and held, the sample being processed using the plasma, the plasma processing apparatus comprising:
    a dielectric film which is disposed on a metallic base which configure the sample stage, the dielectric film including a conductive film disposed internally therein;
    a first power supply configured to supply high-frequency power to the conductive film;
    at least one aggregation of a plurality of Peltier elements which are housed inside a space in the base and connected in series, each of the plurality of Peltier elements being configured to have both heat generating and cooling functions, and being equipped in contact with a ceiling of the space and separated from the conductive film by the base and the dielectric film; and
    one or more second power supplies, each of the one or more second power supplies being connected to each of the at least one aggregation of the plurality of Peltier elements via a polarity switch and being configured to supply electric power to drive the plurality of Peltier elements to have either of the heat generation or cooling functions; and
    a plurality of current bypass relays, each of which are connected in parallel to the plurality of Peltier elements in each of the at least one aggregation, each of the current bypass relays being configured to adjust amounts of current of the electric power provided from the one or more second power supplies, wherein the base surrounds the Peltier elements and the base is connected to ground potential.

2. The plasma processing apparatus according to claim 1, wherein:
a filter to suppress the high-frequency power from the first power supply is not provided on the feeding path of the second power supply to the Peltier elements, and
the plurality of Peltier elements configuring the aggregation are disposed in a circumferential direction of the sample, and are supplied with the electric power.

3. The plasma processing apparatus according to claim 2, wherein:
the plurality of Peltier elements configuring the aggregation are disposed in a concentric shape in a circumferential direction at a plurality of radial positions of the sample.

4. The plasma processing apparatus according to claim 1, wherein:
the plurality of Peltier elements are configured to execute heating and cooling operations.

5. The plasma processing apparatus according to claim 1, further comprising:
a cooling medium flow channel through which a cooling medium circulates, the cooling medium flow channel disposed below the plurality of Peltier elements in the base and adjusting a temperature of the base.

6. The plasma processing apparatus according to claim 5, wherein:
the cooling medium is water, ethylene glycol, or an insulating cooling medium.

7. The plasma processing apparatus according to claim 1, further comprising:
a plurality of elastic heat insulating placement stages which are housed inside the space in the base, each of the elastic heat insulating placement stages being equipped in contact with a floor of the space,
wherein the Peltier elements are disposed on the elastic heat insulating placement stages and held in contact with the ceiling of the space by the elastic heat insulating placement stages.

8. The plasma processing apparatus according to claim 1, wherein:
each of the plurality of bypass relays are configured to switch one period in which a smaller current of the electric power is provided and another period in which a larger current of the electric power is provided to each of the plurality of Peltier elements connected in parallel.

* * * * *